(12) United States Patent
Anderson et al.

(10) Patent No.: US 8,963,211 B2
(45) Date of Patent: Feb. 24, 2015

(54) METHOD, STRUCTURE AND DESIGN STRUCTURE FOR CUSTOMIZING HISTORY EFFECTS OF SOI CIRCUITS

(71) Applicant: International Business Machines Corporation, Armonk, NY (US)

(72) Inventors: Brent A. Anderson, Jericho, VT (US); Andres Bryant, Burlington, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/793,185

(22) Filed: Mar. 11, 2013

(65) Prior Publication Data

US 2013/0187243 A1    Jul. 25, 2013

Related U.S. Application Data

(62) Division of application No. 12/055,686, filed on Mar. 26, 2008, now Pat. No. 8,420,460.

(51) Int. Cl.
*H01L 29/76* (2006.01)
*H01L 29/78* (2006.01)
*H01L 29/423* (2006.01)
(Continued)

(52) U.S. Cl.
CPC .......... *H01L 29/78* (2013.01); *H01L 29/42384* (2013.01); *H01L 29/4908* (2013.01)
USPC ........... 257/213; 257/368; 257/406; 257/499; 257/E27.046; 257/E21.632

(58) Field of Classification Search
CPC ......... H01L 21/70; H01L 21/77; H01L 27/00; H01L 21/8238; H01L 27/1807; H01L 29/78; H01L 29/42834; H01L 29/4908
USPC ........... 257/69, 204, 213, 368, 491, 499, 500, 257/E27.046, E27.062, E27.064, E27.108, 257/E27.001, E27.036, E27.048, E27.098, 257/E27.102, 369, 406, 407
See application file for complete search history.

(56) References Cited

U.S. PATENT DOCUMENTS

| 4,416,405 A | 11/1983 | Caillouet |
| 5,536,950 A | 7/1996 | Liu et al. |

(Continued)

FOREIGN PATENT DOCUMENTS

JP    2004-207517    *    7/2004    ............. H01L 29/78

OTHER PUBLICATIONS

Schwartz et al., "Handbook of Semiconductor Interconnection Technology", Taylor and Francis Group, LLC., Second Edition, 2006, pp. 171 and 256.

(Continued)

*Primary Examiner* — Galina Yushina
(74) *Attorney, Agent, or Firm* — Michael LeStrange; Roberts Mlotkowski Safran & Cole, P.C.

(57) ABSTRACT

A design structure is embodied in a machine readable medium for designing, manufacturing, or testing a design. The design structure includes a high-leakage dielectric formed over an active region of a FET and a low-leakage dielectric formed on the active region and adjacent the high-leakage dielectric. The low-leakage dielectric has a lower leakage than the high-leakage dielectric. Also provided is a structure and method of fabricating the structure.

13 Claims, 6 Drawing Sheets

(51) Int. Cl.
*H01L 29/49* (2006.01)
*H01L 21/02* (2006.01)

(56) References Cited

U.S. PATENT DOCUMENTS

| | | | |
|---|---|---|---|
| 5,747,353 A | 5/1998 | Bashir et al. | |
| 5,777,362 A | 7/1998 | Pearce | |
| 5,844,285 A | 12/1998 | Kwon | |
| 5,962,895 A | 10/1999 | Beyer et al. | |
| 6,124,189 A * | 9/2000 | Watanabe et al. | 438/586 |
| 6,124,613 A | 9/2000 | Kokubum | |
| 6,156,589 A | 12/2000 | Noble | |
| 6,268,630 B1 | 7/2001 | Schwank et al. | |
| 6,300,657 B1 | 10/2001 | Bryant et al. | |
| 6,307,237 B1 | 10/2001 | Erstad | |
| 6,406,945 B1 | 6/2002 | Lee et al. | |
| 6,429,477 B1 | 8/2002 | Mandelman et al. | |
| 6,429,487 B1 | 8/2002 | Kunikiyo | |
| 6,488,618 B1 | 12/2002 | Paolitto et al. | |
| 6,492,695 B2 | 12/2002 | Lutze | |
| 6,498,371 B1 | 12/2002 | Krishnan et al. | |
| 6,506,654 B1 | 1/2003 | Wei et al. | |
| 6,514,808 B1 | 2/2003 | Samavedam et al. | |
| 6,550,651 B1 | 4/2003 | Murdoch et al. | |
| 6,624,459 B1 | 9/2003 | Dachtera et al. | |
| 6,627,511 B1 | 9/2003 | Racanelli et al. | |
| 6,630,376 B1 | 10/2003 | Krishnan et al. | |
| 6,633,067 B2 | 10/2003 | Noble | |
| 6,642,579 B2 | 11/2003 | Fung | |
| 6,666,545 B2 | 12/2003 | Liu et al. | |
| 6,670,675 B2 | 12/2003 | Ho et al. | |
| 6,677,645 B2 | 1/2004 | Nowak et al. | |
| 6,724,048 B2 | 4/2004 | Min et al. | |
| 6,740,551 B2 | 5/2004 | Yoshida et al. | |
| 6,784,101 B1 | 8/2004 | Yu et al. | |
| 6,815,282 B2 | 11/2004 | Dachtera et al. | |
| 6,868,000 B2 | 3/2005 | Chan et al. | |
| 6,907,584 B1 | 6/2005 | Milne et al. | |
| 6,911,010 B2 | 6/2005 | Dirks et al. | |
| 6,939,752 B1 | 9/2005 | Liu et al. | |
| 6,940,130 B2 | 9/2005 | Bryant et al. | |
| 6,953,738 B2 | 10/2005 | Veeraraghavan et al. | |
| 6,960,810 B2 | 11/2005 | Fechner | |
| 6,974,998 B1 | 12/2005 | Liu et al. | |
| 6,992,358 B2 | 1/2006 | Hieda et al. | |
| 7,033,895 B2 | 4/2006 | Lee et al. | |
| 7,078,773 B2 | 7/2006 | Chan et al. | |
| 7,192,816 B2 | 3/2007 | Fechner | |
| 7,244,640 B2 | 7/2007 | Yang et al. | |
| 7,269,860 B2 | 9/2007 | Dennis et al. | |
| 7,273,794 B2 | 9/2007 | Hakey et al. | |
| 7,348,247 B2 | 3/2008 | Park | |
| 7,632,745 B2 | 12/2009 | Chen | |
| 2002/0011612 A1 | 1/2002 | Hieda | |
| 2002/0022360 A1 | 2/2002 | Kim et al. | |
| 2002/0040998 A1 | 4/2002 | Lee | |
| 2002/0045296 A1 | 4/2002 | Yagishita et al. | |
| 2004/0067619 A1 | 4/2004 | Niimi et al. | |
| 2004/0155317 A1 * | 8/2004 | Bhattacharyya | 257/616 |
| 2005/0018380 A1 | 1/2005 | Yeo et al. | |
| 2005/0023633 A1 * | 2/2005 | Yeo et al. | 257/500 |
| 2005/0121703 A1 | 6/2005 | Hieda et al. | |
| 2005/0269634 A1 | 12/2005 | Bojarczuk et al. | |
| 2005/0269635 A1 | 12/2005 | Bojarczuk et al. | |
| 2005/0269648 A1 | 12/2005 | Basceri et al. | |
| 2007/0063277 A1 * | 3/2007 | Belyansky et al. | 257/347 |
| 2007/0189076 A1 * | 8/2007 | Abadeer et al. | 365/185.24 |
| 2008/0064194 A1 | 3/2008 | Hong | |
| 2009/0242985 A1 | 10/2009 | Anderson et al. | |
| 2009/0243000 A1 | 10/2009 | Anderson et al. | |
| 2009/0243029 A1 | 10/2009 | Anderson et al. | |

OTHER PUBLICATIONS

Hollauer, "Modeling of Thermal Oxidation and Stress Effects", 2.4 Oxidation Parameters, 2007, (8 pages).

Colombo et al., "GateDielectric Process Technology for the Sub-1 nm Equivalent Oxide Thickness (EOT) Era", The Electrochemical Society Interface, Fall 2007, pp. 51-55.

Chen et al., "High-Performance Polycrystalline Silicon Thin-Film Transistors with Oxide-Nitride-Oxide Gate Dielectric and Multiple Nanowire Channels", Elsevier Science Direct, This Solid Films, Sep. 20, 2006, pp. 1112-1116.

Office Action dated Oct. 21, 2014 in U.S. Appl. No. 13/747,798; 12 pages.

* cited by examiner

METHOD, STRUCTURE AND DESIGN STRUCTURE FOR CUSTOMIZING HISTORY EFFECTS OF SOI CIRCUITS

FIELD OF THE INVENTION

The present invention generally relates to a structure for customizing history effects of a transistor, a design structure and method of manufacture, and more particularly, to a structure selectively using a high-leakage dielectric to customize for leakage history effects of a circuit, a design structure for customizing leakage history effects of a circuit and a method of manufacturing such structure.

BACKGROUND OF THE INVENTION

History effect in SOI circuits can lead to less-than-optimal delay-vs.-power circuits due to elevated stimulated leakage and worst-case-history timing for applications. More specifically, Partially-Depleted Silicon On Insulator (PDSOI) technology features a "floating body'" which can be described as a region of silicon beneath the FET channel which is undepleted of its equilibrium carrier concentration, and is largely electrically neutral. This floating body will vary in electric potential (voltage) with use of the transistor.

There are two types of effects that determine the body potential, namely leakage sources, which are static in nature, and capacitive coupling, which is intrinsically transient in its influence on body voltage. The two effects taken with the recent electrical states of a PDSOI FET determine the body voltage.

As the body voltage varies, the FET threshold-voltage (Vt), and hence, the drive currents are influenced. The final outcome of such variations is that the detailed performance of a circuit employing PDSOI will be a function of the most-recent history of use of the circuit. For example, if the circuit has been inactive for some time greater than the relaxation times of the FETs, then the performance will be characteristic of that obtained with body voltages at equilibrium. This is the so-called first-switch state.

By contrast, if the same circuit is stimulated a short-time after the "first-switch" event (i.e., a time significantly less than the relaxation times of the FET body voltage), the body voltages will have been perturbed from the equilibrium values by capacitive coupling from source, drain, and gate, to the body. This will result in a different set of body voltages and, hence, a different, "second-switch," performance will be characteristic of the circuit.

Using the first and second switch events, the history can be defined as:

$$\text{History} = [T1 - T2] / [(\frac{1}{2}) * (T1 + T2)]$$

where T1=1st switch delay and T2=2nd switch delay. And, the gate-to-body leakage can affect history in two ways:

1. For T1, the load device has its 1st-switch Vt lowered (closer to zero) which causes the load FET to buck the transition more effectively and hence increase the value of T1; and
2. In the second switch, the body of the load device is unaffected, while the active device now has a more forward-biased body, and hence is faster.

Thus the second switch becomes faster with increasing gate-to-body leakage, so the net is that history becomes more positive.

However, to minimize variability, and to maximize switching speed per unit power, it is desirable to minimize history, i.e., History=0. To do this, current technology optimizes the circuit by minimizing history, averaged over typical use conditions. But differing history behavior by circuit topology (e.g., inverter, vs. nand, nor, pass-gate, etc.) has left a wide range of history-effect within a real product.

Accordingly, there exists a need in the art to overcome the deficiencies and limitations described hereinabove.

SUMMARY OF THE INVENTION

In a first aspect of the invention, a structure comprises a high-leakage dielectric formed over an active region of a FET and a low-leakage dielectric formed on the active region and adjacent the high-leakage dielectric. The low-leakage dielectric has a lower leakage than the high-leakage dielectric.

In an additional aspect of the invention, a method comprises forming a high-leakage dielectric on an active region of a device and a low-leakage dielectric on a portion of the active region of the device. The method further comprises forming a gate electrode over the high-leakage dielectric and the low-leakage dielectric.

In a further aspect of the invention, a design structure for adjusting and/or customizing history effects of a circuit is embodied in a machine readable medium for designing, manufacturing, or testing an integrated circuit. The design structure comprises a high-leakage dielectric formed over an active region of a FET and a low-leakage dielectric formed on the active region and adjacent the high-leakage dielectric, wherein the low-leakage dielectric has a lower leakage than the high-leakage dielectric.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention generally relates to a structure for customizing history effects of a transistor, a design structure and method of manufacture. More specifically, the present invention is directed to a structure using a high-leakage dielectric, typically comprising a lower-k dielectric, to customize for leakage history effects of a circuit, a design structure for customizing leakage history effects of a circuit and a method of manufacturing such structure. By implementing the invention, it is possible to enable design-modified gate-to-body leakage, which is known to alter history effect. More specifically, the present invention provides the ability to adjust (customize) the history effects of a circuit in order to tailor individual circuits, and to the use of the circuits to provide benefits by reducing variability and delay of the circuit. In this way, it is possible to obtain both the best performance (e.g., smallest circuit delay) and the least variability of delay in CMOS circuits.

Structure and Fabrication Processes

Figure 1:
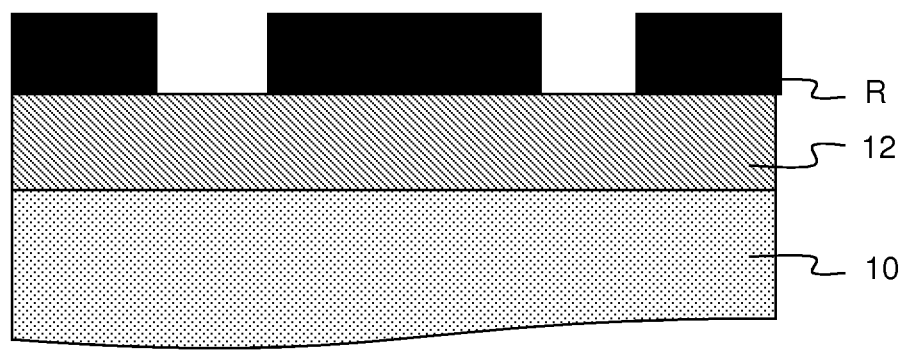
FIGS. 1-6 represent structures and processes for fabricating a device in accordance with the invention.

FIG. 1 represents a beginning structure and processes for fabricating the structure in accordance with the invention.

More specifically, FIG. 1 shows an SOI layer 12 formed on a conventional BOX layer 10 to form a wafer. In non-limiting illustrative embodiments, the BOX layer 10 is between about 100 to 1000 nanometers. As should be understood by those of skill in the art, the SOI layer 12 will include an active silicon portion which will be employed to form a floating body of the FET.

Still referring to FIG. 1, the structure is subjected to conventional lithography and etching processes to form a shallow trench isolation structure. For example, a resist "R" is selectively patterned on the SOI layer 12 to form openings. The resist R can be patterned in any conventional manner such as, for example, exposing the resist R to a light source followed by selective chemical removal. In this example, a mask material (not shown) may be deposited over the resist R at selective portions. Once the mask is formed, using conventional photolithographic processes, holes can be opened to expose portions of the SOI layer 12.

Figure 2:
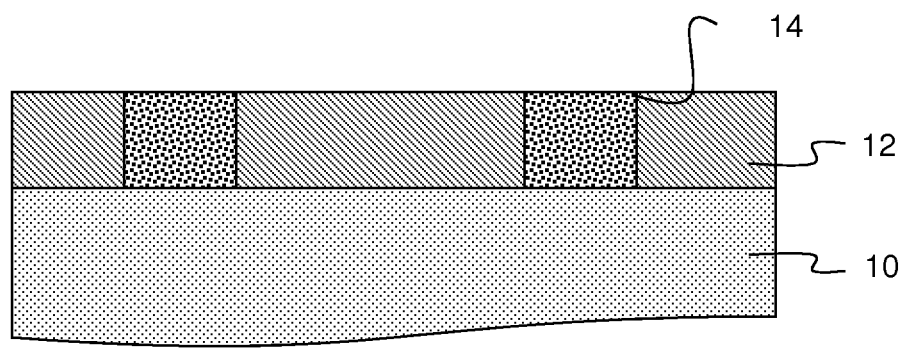

As shown in FIG. 2, the openings are etched to form a shallow trench. More specifically, using conventional etching processes such as, for example, Reactive Ion Etching (RIE), trenches can be formed through the SOI layer 12. After removing the remaining resist pattern, the trenches are filled with oxide to form shallow trench isolation (STI) structures 14. The STI structures 14 will isolate the active regions of the SOI layer 12, resulting in the structure of FIG. 2.

Figure 3:
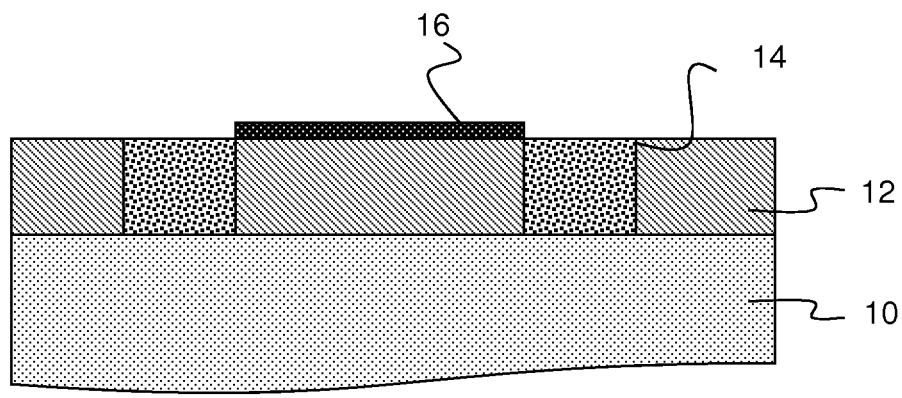

In FIG. 3, a high-leakage dielectric material 16 is grown on the exposed active silicon layer (SOI) 12. In embodiments, the high-leakage dielectric material 16 is silicon dioxide or a silicon oxynitride and more specifically $SiO_2$—SiO—N. In embodiments, the high-leakage dielectric material 16 is grown to a thickness of approximately 0.7 to 2 nanometers. As should be understood by those of skill in the art, the high-leakage dielectric material 16 selectively grows on silicon and hence, is directly adjacent to and abutting the STI structures 14.

Figure 4:
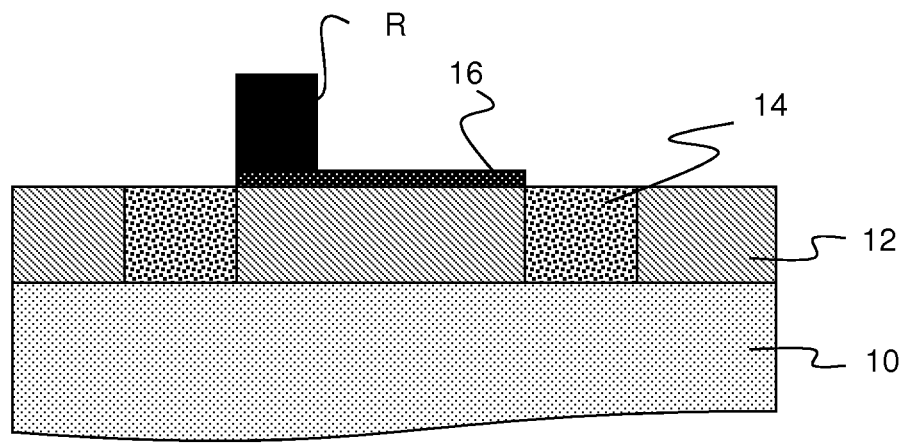

FIG. 4 shows a conventional lithographic process which is designed to protect a portion of the high-leakage dielectric material 16 during a subsequent etching process. In embodiments, the protected area may range from the entire high-leakage dielectric material 16 to only a small percentage thereof, e.g., a minimum lithographic achievable dimension. In embodiments, the protected area is in the range of about 10 nm to 500 nm. The high-leakage dielectric 16 can be adjusted in order to adjust or customize the history effect of the circuit, e.g., adjust the leakage of the circuit. That is, by maintaining the high-leakage dielectric 16 adjacent the active silicon layer (e.g., floating body) in a certain proportion, it is possible to adjust and/or customize the leakage from the gate electrode through the gate dielectric to the floating body.

Figure 5:
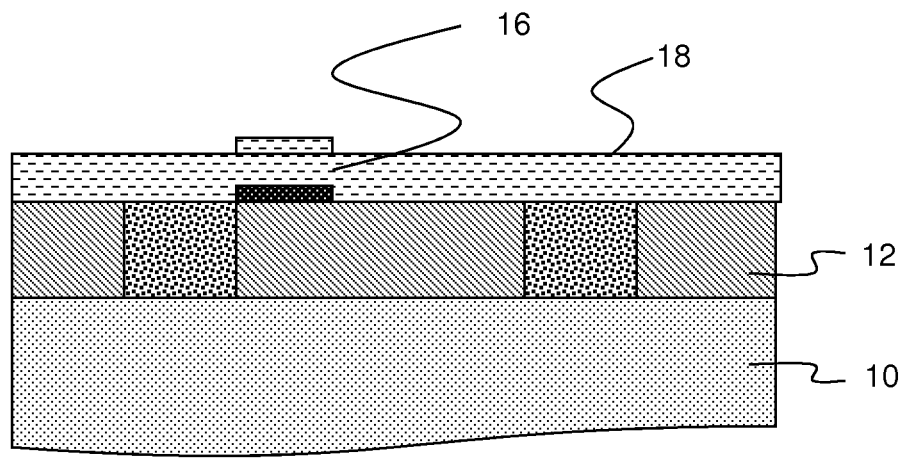

As shown in FIG. 5, a low-leakage dielectric 18 is blanket deposited over the structure of FIG. 4. In embodiments, the low-leakage dielectric 18 is a high-k material such as, for example, $HfO_2$ or $HfSiO_4$. In embodiments, the low-leakage dielectric 18 is about 1.5 nm to 10 nm and more preferably about 2 to 5 nm in thickness.

Figure 6:
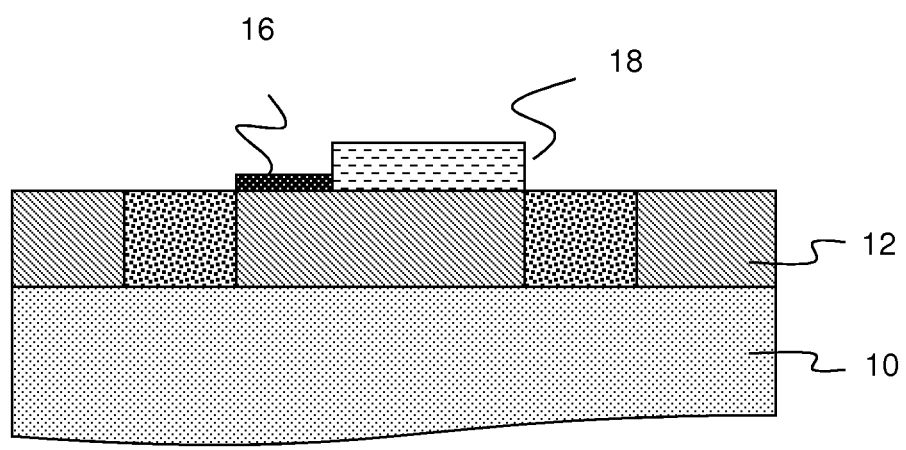

In FIG. 6, the low-leakage dielectric 18 is patterned on the active area of the SOI 12. More specifically, the low-leakage dielectric 18 is patterned in a conventional manner, e.g., lithography and etching processes, to extend over the active region of the SOI 12, e.g., between an STI 14 and the high-leakage dielectric 16. In embodiments, the low-leakage dielectric 18 can overlap with the high-leakage dielectric 16. Also, the present invention contemplates adjusting the ratio of high-leakage dielectric 16 to the low-leakage dielectric 18 so as to customize the history effect of the device.

Figure 7:
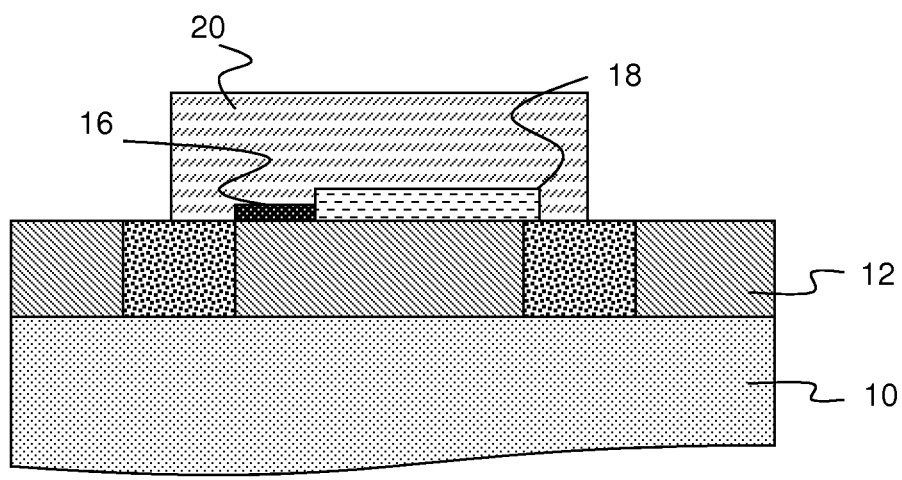
FIG. 7 represents a final structure and respective processes for fabricating the device in accordance with the invention.

As shown in FIG. 7, a gate electrode material 20 is deposited over the structure of FIG. 6 using known deposition processes, e.g., conventional CVD, or ALD process. The gate electrode material 20 may be any conventional gate electrode material such as, for example, a doped polysilicon material. In still further embodiments, the gate electrode material 20 can be any metal layer or metal silicide layer, e.g., TiN, TaN, Tungsten Silicide, Titanium Silicide or Cobalt Silicide. In embodiments, the gate electrode material 20 is patterned to completely cover the high-leakage dielectric 16 and the low-leakage dielectric 18, and extend over portions of the STI structure 14. The gate electrode material 20 is patterned using conventional processes, e.g., lithography and etching, to form the structure shown in FIG. 7.

Figure 8:
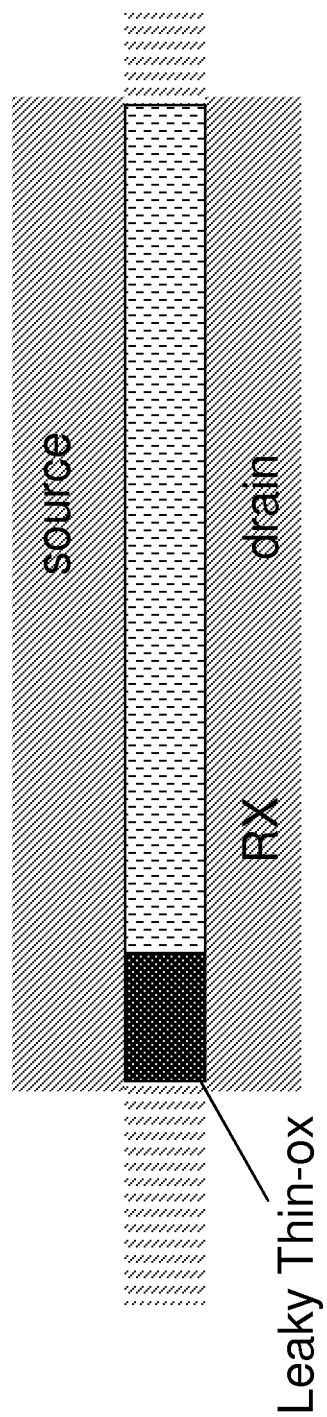
FIG. 8 represents a top view of a final structure in accordance with the invention.

FIG. 8 is a top view of the structure of FIG. 7. Those of skill in the art should understand that the structure shown in FIG. 8 is a single FET. However, it is contemplated by the invention that more than one device can be formed on the substrate or higher levels. Also, in embodiments, the other devices may or may not include the leaky dielectric. For example, it is contemplated that structure further comprises a second FET devoid of a leaky dielectric.

Design Structure

Figure 9:
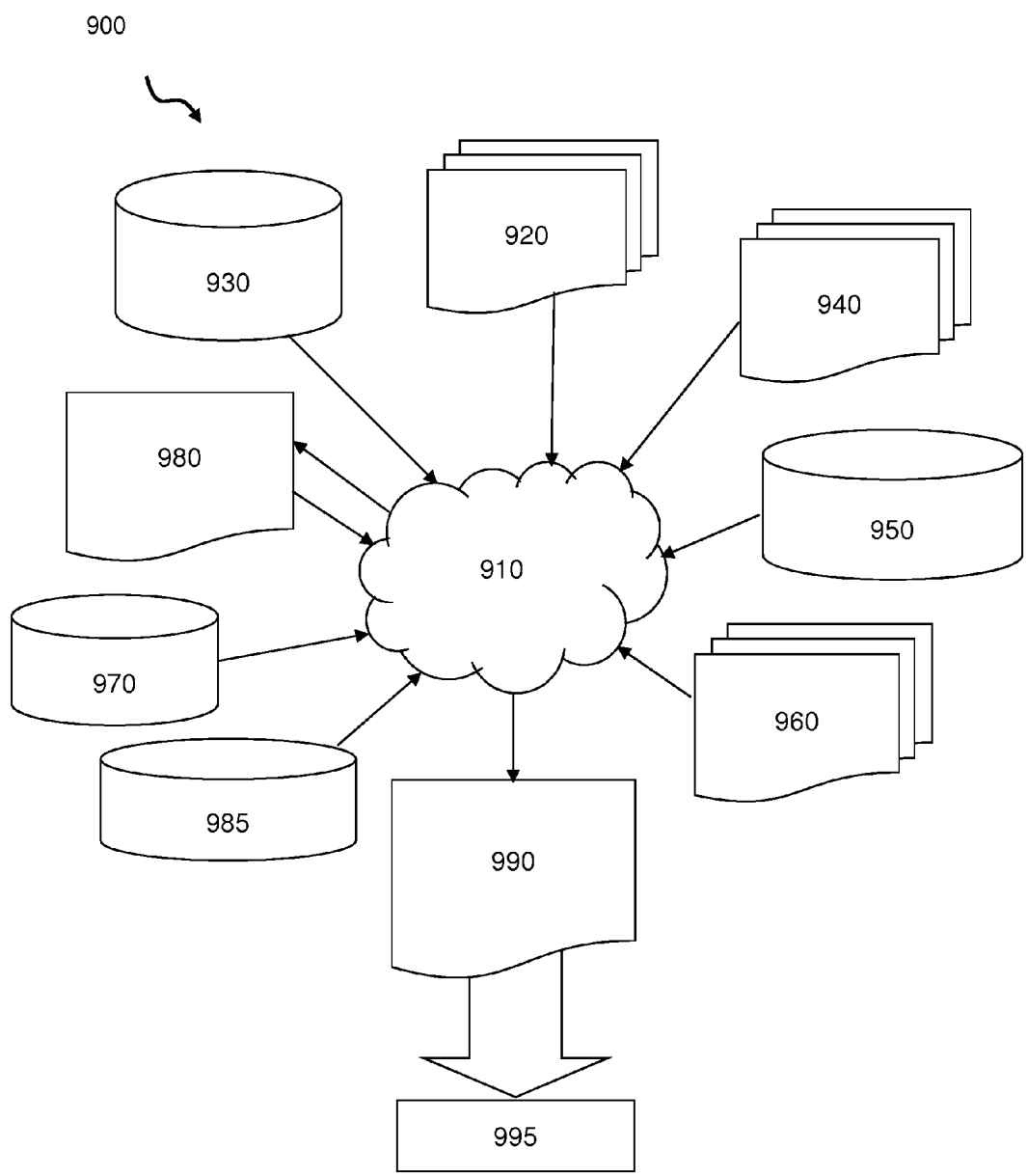
FIG. 9 is a flow diagram of a design process used in semiconductor design, manufacture, and/or test.

FIG. 9 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design from 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIG. 8 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIG. 8. Design process 910 preferably synthesizes (or translates) an embodiment of the invention as shown in FIG. 8 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIG. 8, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 8. Design structure 990 may then proceed to a stage 995 where, for example, design structure 990: proceeds to tape-out, is released to manufacturing, is released to a mask house, is sent to another design house, is sent back to the customer, etc.

The structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those of skill in the art will recognize that the invention can be practiced with modifications and in the spirit and scope of the appended claims.

What is claimed is:

1. A structure comprising a high-leakage dielectric formed directly on an active region of a FET and a low-leakage dielectric formed directly on the active region and adjacent to the high-leakage dielectric, wherein:
   the low-leakage dielectric has a lower leakage than the high-leakage dielectric,
   the low-leakage dielectric is formed higher than the high-leakage dielectric; and
   the low-leakage dielectric overlaps the high-leakage dielectric.

2. The structure of claim 1, wherein the active region forms a floating body of the FET.

3. The structure of claim 1, wherein the high-leakage dielectric is a low-k dielectric.

4. The structure of claim 1, further comprising a gate electrode over the low-leakage dielectric and the high-leakage dielectric.

5. The structure of claim 4, wherein the high-leakage dielectric is formed adjacent to a shallow trench isolation structure.

6. The structure of claim 1, wherein the high-leakage dielectric is a silicon oxynitride.

7. The structure of claim 1, wherein the high-leakage dielectric is $SiO_2$—SiON.

8. The structure of claim 1, wherein the high-leakage dielectric ranges in thickness of between approximately 0.7 to 2 nanometers.

9. The structure of claim 1, wherein the low-leakage dielectric is a high-k dielectric material.

10. The structure of claim 1, wherein the high-leakage dielectric is configured to customize leakage from a gate electrode through to a floating body which is comprised of the active region.

11. The structure of claim 1, wherein the low-leakage dielectric abuts the high-leakage dielectric.

12. The structure of claim 1, wherein:
   a side of the high-leakage dielectric abuts a side of the low-leakage dielectric;
   a lowermost surface of the high-leakage dielectric is directly on the active region;
   a lowermost surface of the low-leakage dielectric is directly on the active region; and
   an uppermost surface of the high-leakage dielectric is below an uppermost surface of the low-leakage dielectric.

13. A structure comprising a high-leakage dielectric formed directly on an active region of a FET and a low-leakage dielectric formed directly on the active region and adjacent to the high-leakage dielectric, wherein:
   the low-leakage dielectric has a lower leakage than the high-leakage dielectric;
   the low-leakage dielectric is formed higher than the high-leakage dielectric;
   the active region is a first portion of a silicon layer;
   the first portion of the silicon layer is separated from other portions of the silicon layer by trench isolation structures;
   the high-leakage dielectric and the low-leakage dielectric are entirely within the first portion;
   the high-leakage dielectric and the low-leakage dielectric entirely cover the first portion;
   a gate electrode entirely covers the high-leakage dielectric and the low-leakage dielectric; and
   the gate electrode covers the trench isolation structures.

* * * * *